US008236576B2

(12) United States Patent
Han et al.

(10) Patent No.: US 8,236,576 B2
(45) Date of Patent: Aug. 7, 2012

(54) MAGNETIC LOGIC ELEMENT WITH TOROIDAL MULTIPLE MAGNETIC FILMS AND A METHOD OF LOGIC TREATMENT USING THE SAME

(75) Inventors: Xiufeng Han, Beijing (CN); Zhongming Zeng, Beijing (CN); Yunan Han, Beijing (CN); Lixian Jiang, Beijing (CN); Zilong Peng, Beijing (CN); Wenshan Zhan, Beijing (CN)

(73) Assignee: Institute of Physics, Chinese Academy of Sciences, Beijing (CN)

( * ) Notice: Subject to any disclaimer, the term of this patent is extended or adjusted under 35 U.S.C. 154(b) by 614 days.

(21) Appl. No.: 12/296,812

(22) PCT Filed: Apr. 11, 2007

(86) PCT No.: PCT/CN2007/001174
§ 371 (c)(1),
(2), (4) Date: Jan. 6, 2009

(87) PCT Pub. No.: WO2007/115509
PCT Pub. Date: Oct. 18, 2007

(65) Prior Publication Data
US 2009/0273972 A1    Nov. 5, 2009

(30) Foreign Application Priority Data

Apr. 11, 2006  (CN) .......................... 2006 1 0072797

(51) Int. Cl.
*G11C 11/02* (2006.01)
*H01L 29/82* (2006.01)
(52) U.S. Cl. ............ 438/3; 257/414; 257/421; 257/427; 257/20; 257/E29.323; 365/157; 365/158; 365/171; 365/172; 365/173; 360/324.2; 29/737
(58) Field of Classification Search .................... 257/20, 257/414, 421–427, E29.323, E21.001; 438/3; 365/157–158, 171–173; 360/324–326, 313; 29/737
See application file for complete search history.

(56) References Cited

U.S. PATENT DOCUMENTS

| 2,931,017 | A  | * | 3/1960  | Bonn et al. ..................... 365/232 |
| 3,150,269 | A  | * | 9/1964  | Vogl, Jr. ........................ 307/415 |
| 3,823,033 | A  | * | 7/1974  | Leonard ........................ 427/566 |
| 3,913,080 | A  | * | 10/1975 | Leo et al. ...................... 365/133 |
| 4,328,564 | A  | * | 5/1982  | Pryor ............................ 365/130 |
| 5,295,097 | A  |   | 3/1994  | Lienau |
| 7,936,597 | B2 | * | 5/2011  | Clinton et al. ................. 365/173 |
| 2003/0123280 | A1 |   | 7/2003 | Brown |
| 2003/0161179 | A1 | * | 8/2003 | Bloomquist et al. .......... 365/171 |
| 2004/0213039 | A1 |   | 10/2004 | Kawabata et al. |
| 2005/0104101 | A1 | * | 5/2005 | Sun et al. ...................... 257/295 |
| 2006/0023496 | A1 |   | 2/2006 | Aouba et al. |

* cited by examiner

*Primary Examiner* — Jami M Valentine
(74) *Attorney, Agent, or Firm* — Connolly Bove Lodge & Hutz LLP

(57) ABSTRACT

A magnetic logic element with toroidal magnetic multilayers (5,6,8,9). The magnetic logic element comprises a toroidal closed section which is fabricated by etching a unit of magnetic multilayers (5,6,8,9) deposited on a substrate. Optionally, the magnetic logic element may also comprise a metal core (10) in the closed toroidal section. Said magnetic multilayers (5,6,8,9) unit is arranged on the input signal lines A, B, C and an output signal line O, and then is made into a closed toroidal. Subsequently, on the toroidal magnetic multilayered unit (5,6,8,9), the input signal lines A', B', C' and an output signal line O' are fabricated by etching. This magnetic logic element can reduce the demagnetization field and the shape anisotropy effectively, leading to the decrease of the reversal field of magnetic free layer. Furthermore, this magnetic logic element has stable working performance and long operation life of the device.

21 Claims, 5 Drawing Sheets

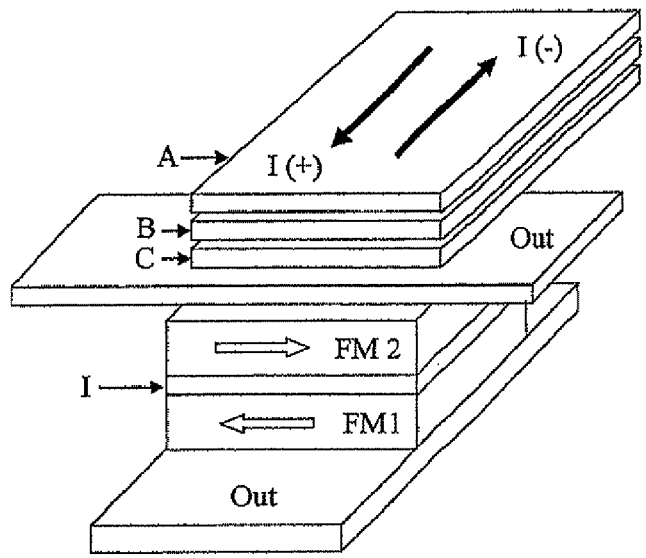
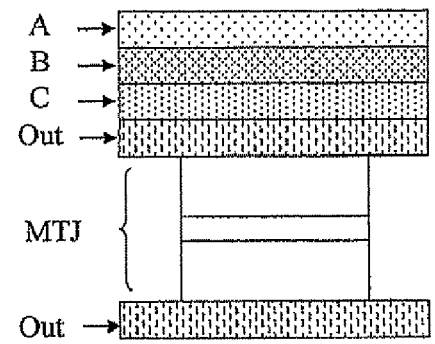
Figure 1a
Figure 1b
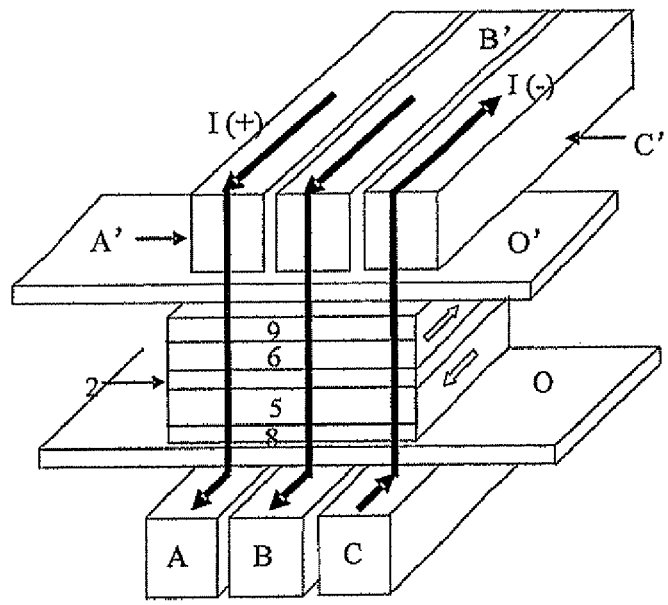
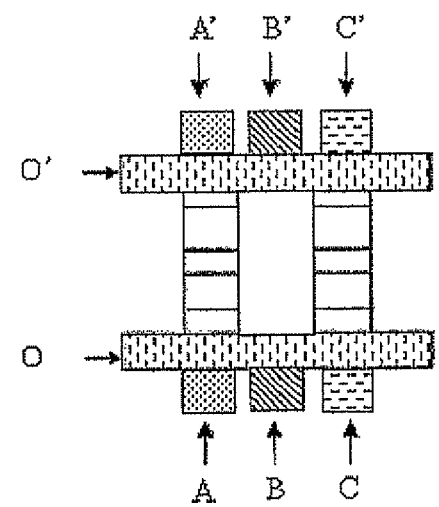
Figure 2a
Figure 2b

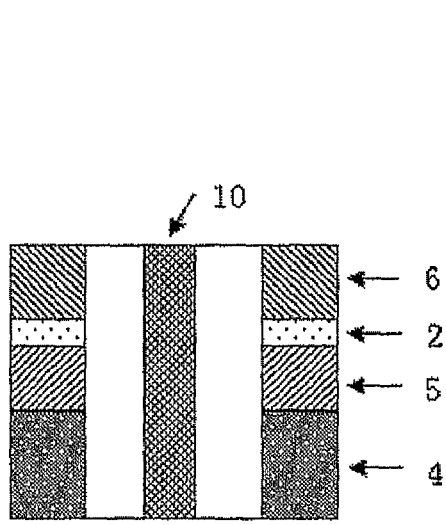
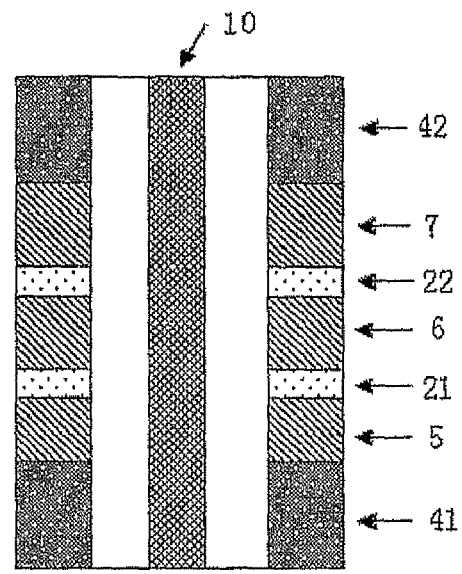
Figure 8a                    Figure 8b
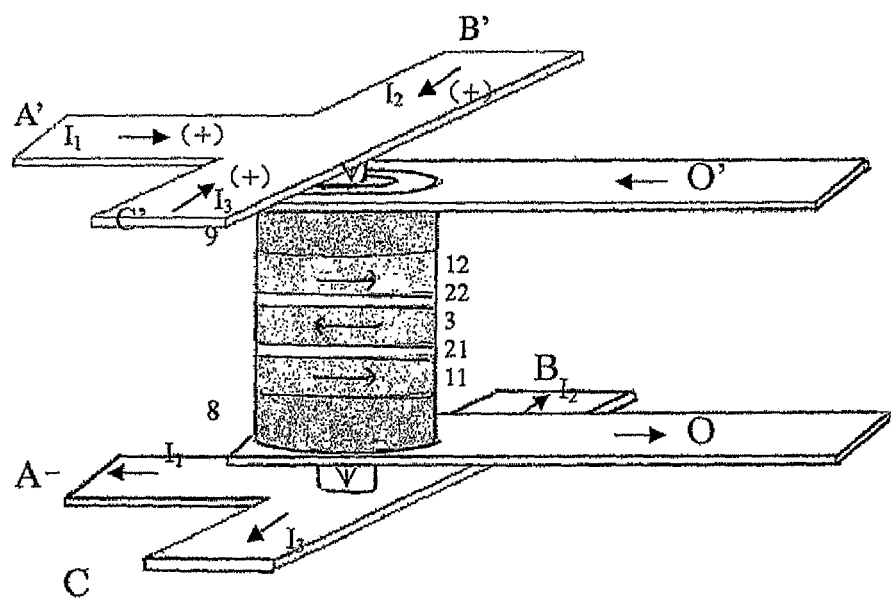
Figure 9

US 8,236,576 B2

MAGNETIC LOGIC ELEMENT WITH TOROIDAL MULTIPLE MAGNETIC FILMS AND A METHOD OF LOGIC TREATMENT USING THE SAME

RELATED APPLICATIONS

This application is a national stage application (under 35 U.S.C. 371) of PCT/CN2007/001174, filed Apr. 11, 2007.

TECHNICAL FIELD

This invention relates to a magnetic logic element and its operating method thereof, and in particular, to a magnetic logic element with toroidal magnetic multilayers and its method for logic process.

BACKGROUND ART

Since the end of 1980s when Baibich et al observed the giant magnetoresistance (GMR) effect in a magnetic multi-layered system, the study of the laminated structure system composed of magnetic layer/non-magnetic layer/magnetic layer has attracted a lot of interest from scientific researchers. Such magnetic element with a giant magnetoresistance effect can not only be widely applied to the field of a magnetic sensor, magnetic record/read head, but also be developed into a radiation-resist and non-volatile magnetic random access memory (MRAM). In recent years, some research groups have proposed that magnetic memory cell can also be designed for computation, i.e., a magnetic logic concept. A logic function is usually realized through two steps of selection and execution of logic operation. Such logic device can become a programmable logic device and a memory device of an instantaneous state electronic output as well. For example, in 2000, William C. Black, Jr. and B. Das from Iowa State University proposed a magnetic logic based on magnetoresistance effect. Two years later, Siemens Research Co. in Germany, demonstrated a reconfigurable magnetic logic element through experiments. Shortly afterwards, Berlin Paul Drude Institute proposed a simpler method to realize switching of various computing elements between different logic states (A. Ney, C. Pampuch, R. Koch and K. H. Pioog, [Nature] vol. 425, pages 485-487 (2003)). Its logic core unit is constituted of a magnetic tunnel junction, and its operating mode diagram and sectional structure diagram is shown in FIGS. 1a and 1b, respectively. Although there are only two output numerical values (0 and 1) in the magnetoresistance element, four different initial states do exist, of which two are parallel states and the other two are counter-parallel states. Thus, different logic states can be configured. Such a single logic element can show the following basic logic functions, "AND" function, "OR" function, "NAND" function and "NOR" function.

However, all the input signal lines in current techniques are disposed on the magnetic multilayers, and the effective magnetic field acting on the magnetic multilayered cell is small, leading to a large operation current. Meanwhile, non-uniform spatial distribution of the magnetic fields will bring an adverse effect. Moreover, the shape of magnetic multilayered cells used in the prior art is a non-closed geometrical structure, such as square, rectangle, circle and ellipse. Such a non-closed structure will bring high demagnetization fields and shape anisotropy under high density and small size, leading to increasing the reversal field of magnetic free layer, and further increasing working current and power consumption for the logic cell. Meanwhile, the vortex magnetic domains are probably produced, resulting in an adverse effect to the uniformity and consistency of the magnetic and electrical properties of the logic element.

CONTENTS OF THE INVENTION

The object of this invention is to overcome the defects of an undesirable non-uniformity and inconsistency of magnetic and electrical properties in the magnetic logic cell, and a large operating current in the current magnetic logic elements, where a non-closed magnetic multilayered cell is being used. This application provides a closed magnetic multilayered logic element with no demagnetization fields and weak shape anisotropy by adopting a toroidal closed magnetic multilayered cell to eliminate the demagnetization field of the magnetic multilayers itself and to reduce shape anisotropy. The switch of the magnetic moment of respective magnetic layers in the closed magnetic multilayered logic element is carried out by the spin-polarized current based on the spin torque & spin-transfer switching effect together with the current-induced Oersted field driving, realizing low power-consumption logic operation method.

The object of this invention is achieved by the following techniques:

The magnetic logic element with toroidal magnetic multilayers in this invention comprises: depositing a conductive metal layer on the substrate and making input signal lines A, B and C and output signal line O by etching; or depositing a conductive metal layer on the input signal lines A, B and C to obtain an output signal line O by etching, and then depositing a cell with toroidal magnetic multilayers; characterized in that: the magnetic multilayers are deposited onto input signal lines A, B and C and output signal line O, then are fabricated into a closed toroidal magnetic multilayered cell followed by the deposition of a conductive metal layer on top of them, and finally the output signal line O' and input signal lines A', B' and C' are formed by etching; or metal conductive layer is deposited on the output signal line O', and is fabricated into input signal lines A', B' and C' by etching.

In the above technical solutions, the closed toroidal magnetic multilayered cell, as disclosed in the Chinese Patent applications No. 200510135365.6, 200610111166.9, and 200710063352.1, comprises the respective layer of the conventional magnetic multilayers, and the cross section of the magnetic multilayers is a closed rectangular ring, or elliptic ring or other polygonal closed shapes, wherein the width of internal rectangular ring is 10~100,000 nm, the width of external rectangular ring is 20~200,000 nm, and the ratio of the width of internal rectangular ring and length thereof is 1:1~5; the short axis of the internal elliptic ring is 10~100,000 nm, the ratio of the short axis and long axis is 1:1~5, the short axis of the external elliptic ring is 20~200,000 nm; the internal side length of the polygonal closed ring is 10~100,000 nm, the external side length thereof is 20~200,000 nm, and the width of the closed ring is 10~100,000 nm.

The working mode diagram of the magnetic logic element with toroidal magnetic multilayers provided in this invention is shown in FIG. 2 or FIG. 5, and FIG. 6 and logic processing method of the magnetic logic element with magnetic multilayers includes the following steps:

1) Logic setting: applying milli-Ampere or less than milli-Ampere of current to two input signal lines A, A' and B, B', or to three input signal lines A, A', B, B', and C, C', intensity of current in each input signal line being identical or different, and all passing through the magnetic multilayers, allocating "0" and "1" to the magnetic multilayered cell respectively, and the reversion of the magnetic moment of various magnetic layers being achieved so as to set logic of the logic element by spin-polarized current based on the spin torque & spin-transfer switching effect and current-induced Oersted field driving;

2) Logic operation: executing the logic operation by activating only two input signal lines A, A' and B, B', or three input signal lines A, A', B, B', and C, C'; only when the magnetic fields with same direction are produced by the currents with same direction passing through the two input signal lines A, A' and B, B', or three input signal lines A, A', B, B', and C, C', a selected initial state can be reversed, changing the output value from "1" to "0", so as to obtain multiple logic states, and the magnitude of the magnetoresistance effect of the magnetic multilayers acting as output signals.

This invention provides another magnetic logic element with toroidal magnetic multilayers, which includes: depositing a conductive metal layer on the substrate, fabricating input signal lines A, B and C and output signal line O by etching; or depositing a conductive metal layer on the input signal lines A, B and C which is fabricated into an output signal line O by etching, and at last depositing a cell with toroidal magnetic multilayers; characterized in that: said magnetic multilayers are deposited onto input signal lines A, B and C and output signal line O, and is fabricated into a closed toroidal magnetic multilayered cell, a metal core is put in the geometrical center of the closed toroidal magnetic multilayered cell followed by the deposition of a conductive metal layer on top of them, which are fabricated into output signal line O' and input signal lines A', B' and C' by etching; or a metal conductive layer is deposited on the output signal line O', then is fabricated into the input signal lines A', B' and C' by etching, wherein at least one of the input signal lines A, A', B, B', and C, C' is connected to said metal core, the shape of the metal core matches that of the closed toroidal magnetic multilayered cell, and its cross section is a rectangular or elliptical or polygonal shape correspondingly.

In the above technical solutions, the closed toroidal magnetic multilayers with metal core, as disclosed in the Chinese Patent applications No. 200510135370.7, 200610011167.3, and 200710063352.1, comprise respective layer of the conventional magnetic multilayers including a metal core located at the geometric center of the toroidal multilayers, the cross section of the magnetic multilayers can be a closed rectangular ring, or elliptic ring or other polygonal closed shapes, wherein the width of internal rectangular ring is 10~100,000 nm, the width of external rectangular ring is 20~200,000 nm, the ratio of the width of internal rectangular ring and length thereof is 1:1~5; the short axis of the internal elliptic ring is 10~100,000 nm, the ratio of the short axis and long axis is 1:1~5; the short axis of the external elliptic ring is 20~200,000 nm; the internal side length of the polygonal closed ring is 10~100,000 nm, the external side length thereof is 20~200,000 nm, and the width of the closed ring is 10~100,000 nm. It also includes a metal core located at the geometric center of the closed toroidal multilayers, the cross section of the metal core can be a closed rectangular ring, or elliptic ring or other polygonal shapes, wherein the width of rectangle is 5~50,000 nm, the ratio of the width and length is 1:1~5; the short axis of the ellipse is 5~50,000 nm, the ratio of the short axis and long axis is 1:1~5; the side length of the polygonal metal core is 5~50,000 nm, the shape of the metal core matches that of the closed magnetic multilayers. The length of the metal core should be larger than the height of the toroidal magnetic multilayered cell so as to contact the input signal lines A', B' and C' or one of them.

Said metal core is made from metal materials with small resistivity, preferably, Au, Ag, Pt, Ta, W, Ti, Cu or Al. The function of the metal core is to produce a circular magnetic field by current applied from its outside, which is used to control the magnetization state of the magnetic multilayers so as to more conveniently conduct logic operation of the magnetic multilayers logic cell.

As compared with the magnetic logic element with toroidal magnetic multilayers discussed above, the input signal line C in current solution is a functional line. Since the signal line C does not penetrate the magnetic multilayers, the bearable current is larger which produces a higher circular magnetic field, so that it conveniently controls the magnetization state of the toroidal closed magnetic multilayers. In this structure, the magnetic multilayered cell has two output numerical values (0 and 1), but four different initial states where two being parallel states and two completely anti-parallel states, so that it can configure several different logic states. The specific procedure is divided into two steps: first step, applying the current to two or three input lines in order to set the polarity of the logic element as either of the above four states; second step, executing the logic operation by only activating the above two input lines (i.e., A and B) or three input lines (A, B and C). It is worthy to note that, only when the current passing through the two input signal lines or three input signal lines produces magnetic fields with the same polarity, a selected initial state can be reversed, changing the output value from "1" to "0", leading to multiple logic states.

The logic processing method of above magnetic logic element with magnetic toroidal multilayers includes the following steps:

1) Logic setting: applying milli-Ampere or less than milli-Ampere current to two input signal lines A, A' and B, B', or three input signal lines A, A', B, B', and C, C', the intensity of current applied to each input signal line being identical or different, and all passing the metal core of the toroidal closed magnetic multilayers, without passing the magnetic multilayers; or the current being applied to two input lines A and B passing the magnetic multilayers, the current being applied the other input line C (also called functional line) passing the metal core, each being allocated with "0" and "1" so as to set the logic of the logic element;

2) Logic operation: executing the logic operation by activating only two input signal lines A, A' and B, B', or three input signal lines A, A', B, B', and C, C'; only when the magnetic fields with same polarity are produced by the currents with same direction passing through the two input signal lines A, A' and B, B', or three input signal lines A, A', B, B', and C, C', a selected initial state can be reversed, changing the output value from "1" to "0", the reversion of the magnetic moment of various magnetic layers being achieved by spin-polarized current based on the spin torque & spin-transfer switching effect and current-induced Oersted field driving, so as to obtain multiple logic states, and the magnitude of the magnetoresistance effect of the magnetic multilayers acting as output signals.

The magnetic multilayers used for the logic cell with toroidal magnetic multilayers or toroidal magnetic multilayers with metal core as described in this invention includes non-pinning and pinning types, if categorized according to materials used.

With respect to the non-pinning type, the first core structure of its magnetic multilayers comprises: a lower buffering conductive layer (BL), a hard ferromagnetic layer (hereinafter simplified as HFM), an intermediate layer (I1), a soft ferromagnetic layer (hereinafter simplified as SFM), and an upper cover layer (CL).

With respect to the non-pinning type, the second core structure of its magnetic multilayers comprises: a lower buffering conductive layer (BL), a lower hard ferromagnetic layer (HFM1), a first intermediate layer (I1), a soft ferromagnetic layer (SFM), a second intermediate layer (I2), an upper hard ferromagnetic layer (HFM2), and an upper cover layer (CL).

Said hard ferromagnetic layer (HFM), lower hard ferromagnetic layer (HFM1), and upper hard ferromagnetic layer (HFM2) are made from ferromagnetic materials of Co, Fe, Ni, CoFe, NiFeCo, with the thickness of 2~20 nm.

Said intermediate layer (I), first intermediate layer (I1), and second intermediate layer (I2) are composed of metal layer or insulator barrier, wherein the metal includes Ti, Zn, ZnMn, Cr, Ru, Cu, V or TiC; the insulator barrier material includes $Al_2O_3$, MgO, TiO, ZnO, (ZnMn)O, CrO, or TiCo, the intermediate layer with the thickness of 0.6~10 nm.

Said soft ferromagnetic layer (SFM) is made from ferromagnetic material with high spin polarization and low coercivity, including: Co, Fe, Ni or their alloys NiFe, CoFeSiB, NiFeSiB, or amorphous $Co_{100-x-y}Fe_xB_y$ ($0<x<100, 0<y \leq 20$), or Heusler alloys, such as $CO_2MnSi$, $Co_2Cr_{0.6}Fe_{0.4}Al$; the soft ferromagnetic materials are preferably made from $CO_{90}Fe_{10}$, $CO_{75}Fe_{25}$, $CO_{40}Fe_{40}B_{20}$, or $Ni_{79}Fe_{21}$; the thickness of said soft ferromagnetic layer being 1~20 nm.

With respect to the pinning type, the first core structure of its magnetic multilayers comprises: a lower buffering conductive layer (BL), an anti-ferromagnetic pinning layer (AFM), a pinned magnetic layer (FM1), an intermediate layer (I), a free soft ferromagnetic layer (FM2), and an upper cover layer (CL).

With respect to the pinning type, the second core structure of its magnetic multilayers comprises: a lower buffering conductive layer (BL), an anti-ferromagnetic pinning layer (AFM), an artificial anti-ferromagnetic-coupling magnetic layer, an intermediate layer (I), a free soft ferromagnetic layer (FM2), and an upper cover layer (CL).

With respect to the pinning type, the third core structure of its magnetic multilayers comprises: a lower buffering conductive layer (BL), a lower anti-ferromagnetic pinning layer (AFM1), a pinned magnetic layer (FM1), a first intermediate layer (I1), a free soft ferromagnetic layer (FM2), a second intermediate layer (I2), an upper pinned ferromagnetic layer (FM3), an upper anti-ferromagnetic pinning layer (AFM2), and an upper cover layer (CL).

With respect to the pinning type, the fourth core structure of its magnetic multilayers comprises: a lower buffering conductive layer (BL), a lower anti-ferromagnetic pinning layer (AFM1), an artificial anti-ferromagnetic-coupling magnetic layer, a first intermediate layer (I1), a free soft ferromagnetic layer (FM2), a second intermediate layer (I2), an artificial anti-ferromagnetic-coupling magnetic layer, an upper anti-ferromagnetic pinning layer (AFM2), and an upper cover layer (CL).

Said artificial anti-ferromagnetic-coupling magnetic layer is composed of two pinned ferromagnetic layers (FM1) or a free soft ferromagnetic layer (FM2) or an upper pinned ferromagnetic layer (FM3) sandwiched with a layer of Ru.

Said anti-ferromagnetic pinning layer (AFM), lower anti-ferromagnetic pinning layer (AFM1) and upper anti-ferromagnetic pinning layer (AFM2) are made from alloy materials such as Ir, Fe, Rh, Pt or Pd and Mn, or anti-ferromagnetic materials such as CoO, NiO, PtCr, with a thickness of 6~20 nm.

Said pinned ferromagnetic layer (FM1), free soft ferromagnetic layer (FM2), upper pinned ferromagnetic layer (FM3), artificial anti-ferromagnetic-coupling magnetic layer are made from ferromagnetic material, semi-metal magnetic material or magnetic semiconductor material, each magnetic layer having a thickness of 2~10 nm.

Said ferromagnetic material includes: 3d transition magnetic metals such as Fe, Co, Ni, ferromagnetic alloys such as Co—Fe, Co—Fe—B, Ni—Fe, Co—Fe—Ni, Gd—Y, and rare-earth metals and their ferromagnetic alloys such as Pr, Nd, Sm, Gd, Tb, Dy, Ho, Lr.

Said semi-metal magnetic material includes Heussler alloys of $Fe_3O_4$, $CrO_2$, $La_{0.7}Sr_{0.3}MnO_3$ and $CO_2MnSi$.

Said magnetic semiconductor material includes: Fe, Co, Ni, V and Mn doped ZnO, $TiO_2$, $HfO_2$ and $SnO_2$, also Mn doped GaAs, InAs, GaN and ZnTe as well.

Said Ru layer has a thickness of 0.7~0.9 nm.

Said intermediate layer (I), first intermediate layer (I1), and second intermediate layer (I2) are made from insulating oxides such as MgO, $Al_2O_3$, AlN, $Ta_2O_5$, or $Hf_2$, or metal materials such as Ti, Zn, ZnMn, Cr, Ru, Cu, V or TiC, having a thickness of 0.6~10 nm.

Said toroidal closed magnetic multilayered cell, or the toroidal magnetic multilayered cell with metal core, in addition to the above multilayered core structure, it comprises a lower buffering conductive layer (BL) at the bottom of the multilayered core structure and an upper cover layer (CL) at the top of the multilayered core structure. The lower buffering conductive layer (BL) is made from metal materials, preferably Ta, Ru, Cr, Au, Ag, Pt, Ta, W, Ti, Cu, Al or Si—Al alloy with a thickness of 2~200 nm, and the cover layer (CL) is made from metal material which is not liable to be oxidized and has high resistance, preferably Ta, Ru, Pt, Ag, Au, Cr, or their alloys with a thickness of 2~200 nm.

The advantages for the magnetic logic element based on the toroidal closed magnetic multilayers provided in this invention are: the magnetic multilayered cell adopts a toroidal closed structure, which can effectively reduce high demagnetization field and shape anisotropy due to high density and small size, so as to reduce the reverse field of magnetic free layer, and further reduce current and power consumption during the logic operation. Moreover, the input line penetrates directly the magnetic multilayers, thus avoiding an adverse effect caused by non-uniform space distribution of the magnetic field, and facilitating stability of the operating performance of the logic element and life extension of the device.

The non-closed structure, such as square, rectangular and elliptic shapes are used in current techniques, which would lead to large demagnetization field and shape anisotropy under high density and small size. The closed toroidal structure adopted by this invention is able to reduce the high demagnetization field and shape anisotropy of such magnetic logic element, so as to reduce the reverse field of magnetic free layer, leading to lower current and power consumption during the logic operation. The toroidal closed structure adopted by this invention even more facilitates the direct circular magnetic driving by the spin-polarized current based on spin torque & spin-transfer switching effect and current-induced Oersted field to reverse the magnetic moment of respective magnetic layers and to realize lower power consumption during logic operation.

DESCRIPTION OF FIGURES

FIGS. 1a and 1b are the working mode diagram and cross sectional diagram of the current magnetic logic element, respectively;

FIGS. 2a and 2b show the working mode diagram and cross sectional diagram respectively of one of the magnetic logic elements of the closed rectangular toroidal non-pinning magnetic multilayers of this invention without metal core;

FIGS. 8a and 8b show the cross sectional diagrams of the magnetic multilayered cells of the magnetic logic elements of the closed toroidal pinning magnetic multilayers of this invention with metal core;

FIG. 9 is the working mode diagram of the magnetic logic element of the closed toroidal non-pinning magnetic multilayers of this invention with metal core;

Figure 3A:
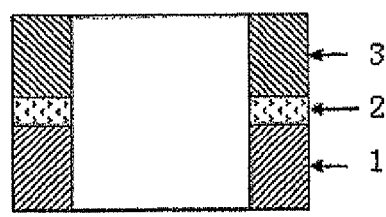
FIGS. 3a and 3b show the cross sectional diagrams of the magnetic multilayered cells of the magnetic logic elements of the closed toroidal non-pinning magnetic multilayers of this invention without metal core.

Where, HFM is the hard ferromagnetic layer 1, I is the intermediate layer 2, SFM is the soft ferromagnetic layer 3, HFM1 is the lower hard ferromagnetic layer 11, I1 is the first intermediate layer 21, I2 is the second intermediate layer 22, HFM2 is the upper hard ferromagnetic layer 12, AFM is the anti-ferromagnetic pinning layer 4, FM1 is the pinned magnetic layer 5, FM2 is the free soft ferromagnetic layer 6, AFM1 is the lower anti-ferromagnetic pinning layer 41, FM3 is the upper pinned ferromagnetic layer 7, AFM2 is the upper anti-ferromagnetic pinning layer 42, BL is the lower buffering conductive layer 8, CL is the upper cover layer 9, input signal lines A, B, C and A', B', C', output signal lines O', O, MC is metal core 10, and 13 is the substrate.

MODE OF CARRYING OUT THE INVENTION

Example 1

The first structure of the magnetic logic element of this invention based on the closed toroidal magnetic multilayers will be described in detail in conjunction with the fabricating methods and diagrams as follows:

Referring to FIGS. 2a, 2b and 3a, the first magnetic logic element of this invention based on the closed toroidal magnetic multilayers is fabricated in a high vacuum magnetron sputtering equipment and by magnetron sputtering process. First, 1 mm thick $SiO_2/Si$ substrate 13 is selected to be cleaned with conventional method. On the cleaned substrate 13, a conductive metal layer Pt of 100 nm thickness is deposited, then the up-to-date micro-fabrication process is used. That is to say, the resist is coated and pre-baked, and the substrate is exposed on the UV exposure machine according to the patterns with designed input signal lines and output signal lines, followed by development fixing and post-baking, and then the shape of the input and output signal lines is fabricated by ion etching process, and finally the resist is removed by dipping into the resist-remover to obtain three parallel input signal lines A, B, C and one output signal line O. Or on the three parallel input signal lines A, B, C, a conductive metal layer Pt is deposited again, and one output signal line O is fabricated by the above micro-fabrication process (as shown in FIG. 2a). On the top of the output signal line O, a Ru lower buffering conductive layer 8 of 10 nm thickness, a Co hard ferromagnetic layer 1 of 5 nm thickness, and an Al intermediate layer 2 of 1 nm thickness followed by the oxidization into AlO by plasma, and a Co soft ferromagnetic layer 3 of 2 nm thickness, and a Ru cover layer 9 of 5 nm thickness is deposited sequentially. The growth condition for the above multilayers includes: background vacuum: $5\times10^{-6}$ Pa; the pressure of the high purity argon for sputtering: 0.07 pa; sputtering power: 120 W; speed of the rotating sample holder: 20 rmp; growing temperature: room temperature; growth rate: 0.3~1.1 Å/s; growth time: film thickness divided by growth rate; during the deposition of the hard ferromagnetic layer I and soft ferromagnetic layer 3, a in-plane magnetic field of 150 Oe being applied. The magnetic multilayers will be patterned by the micro-fabrication process. It includes the resist coating, pre-baking, and the exposure of substrate on the electron beam exposure machine according to the designed toroidal patterns, followed by development, fixing and post-baking, and then the magnetic multilayers are fabricated to be toroidal shape by ion etching, and finally the resist is removed by dipping stripping chemicals to form a closed rectangular ring-shape geometric structure, with an internal diameter of 200 nm, external diameter of 250 nm, width of 50 nm, and the ratio between the internal widths for the short side and the long side of the rectangular ring is 1:1. Then, a 100 nm thick $SiO_2$ insulating layer is deposited on the etch-shaped toroidal magnetic multilayers by conventional film growth method, such as magnetron sputtering, electron beam evaporation, pulse laser deposition, electro-chemical deposition, molecular beam epitaxy so that all the toroidal multilayers are buried and isolated from each other. The etching is carried out by the micro-fabrication process as following, firstly locating the position of the closed toroidal multilayers in the focusing ion beam equipment followed by an etch of the $SiO_2$ insulating layer with focusing ion beam etching process to expose toroidal magnetic multilayers buried under the insulating layer. Finally, a metal conductive layer Cu of 100 nm thick is deposited by a high vacuum magnetron sputtering equipment, with the growth conditions as described above, processing input signal lines A', B', C' and an output signal line O' with the conventional semiconductor micro-fabrication process, i.e., first resist coating and pre-baking, and then exposing the mask with patterns on a UV exposure machine, followed by development, fixing and post-baking, and then etching the metal conductive layer on the magnetic multilayers by ion etching into shapes of input and output signal lines, and then the resist is removed by dipping into the resist-remover to obtain the logic element of this invention with toroidal magnetic multilayers.

All the three input signal lines (A, B, C) penetrate the closed toroidal magnetic multilayered cell, where the current flowing through each input line are identical, allocating "0" and "1" to them, and the magnetizing direction of each magnetic layer in the magnetic multilayers is determined by combination of input signals A, B, C. The magnitude of the magnetoresistance ratio through the magnetic multilayered cell is used as the output signal, which is output by the output signal line. In this solution, realization of the logic function is divided into two steps: first step is logic setting; the second step is logic operation. When the input current is only applied to input line A, the magnetization of each layer does not change; when the input current is applied to input lines A and B simultaneously, the magnetization of the soft ferromagnetic layer (SFM) 3 may reverse; and when the input current is applied to input lines A, B and C simultaneously, the magnetization of the hard ferromagnetic layer (HFM) 1 may reverse.

First of all, the two most fundamental logic functions "AND" and "NOT". For AND function, first, logic setting: applying current to input lines (A, B and C) to enable the magnetization directions of both the hard ferromagnetic layer (HRM) 1 and soft ferromagnetic layer (SFM) 3 to be counter-clockwise. Second step, logic function, only when inverse current (i.e., a current producing a clock-wise magnetic field) is applied simultaneously to the input lines A and B, the magnetization of the soft ferromagnetic layer (SFM) 3 can be switched from the counter-clockwise direction to clock-wise direction. NOT gate includes similar operation, but at the start, the magnetization of the hard ferromagnetic layer (HFM) 1 is counter-clockwise, while the magnetization of the soft ferromagnetic layer (SFM) 3 is clock-wise. Switching the magnetization of the hard ferromagnetic layer (HFM) 1 and the soft ferromagnetic layer (SFM) 3 may realize the other two basic logic functions, i.e., NOT AND (NAND) or NOT OR NOR). The magnetization of the hard ferromagnetic layer (HFM) 1 and the soft ferromagnetic layer (SFM) 3 may be switched if the current is applied to all input signal lines. The magnetic field to switch the magnetization of soft ferromagnetic layer (SFM) 3 is smaller than the magnetic field to switch the magnetization direction of hard ferromagnetic layer (HFM) 1. Thus, the polarity of the upper and lower layers can be switched independently.

Appropriate combination may constitute any commonly known logic gates.

Example 2

The method of this example for fabricating the second magnetic logic element based on closed toroidal magnetic multilayers is the same as example 1.

Figure 3B:
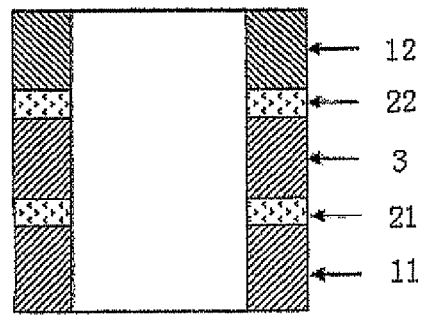
Figure 5:
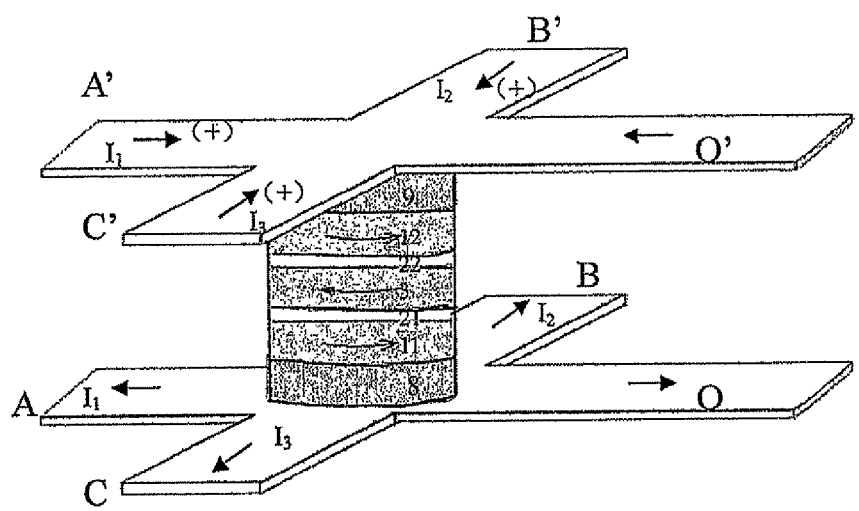
FIG. 5 is the working mode diagram of the magnetic logic element of the closed toroidal non-pinning magnetic multilayers of this invention without metal core.

Referring to FIGS. 5 and 3b, the second magnetic logic element based on closed toroidal magnetic multilayers comprises input signal lines, output signal line and closed toroidal magnetic multilayered cell. The core structure of the closed toroidal magnetic multilayered cell is: a lower hard ferromagnetic layer (HFM1) 11 of a 5 nm thick CoFe, a first intermediate layer (I1) 21 of a 2.4 nm thick Ru, a soft ferromagnetic layer (SFM) 3 of a 4 nm thick NiFeSiB, a second intermediate layer (I2) 22 of a 2.2 nm thick Au, an upper hard ferromagnetic layer (HFM2) 12 on the second intermediate layer of a 4 nm thick CoFe. The closed toroid is a round-shaped ring, with a side length of the internal ring of 200 nm, and a side length of the external ring of 300 nm.

In this solution, the core structure is made from double pseudo-spin-valve, with a small coercivity of soft ferromagnetic layer (SFM) 3 (called free layer) where its magnetization can be easily switched. The upper and lower hard ferromagnetic layers (HFM1) 11 and (HFM2) 12 have a large coercivity, and their magnetizations are relatively fixed with the same reverse fields, acting as one magnetic layer. Thus, the operating mode of the magnetic logic element based on such structure is the same as example 1.

Example 3

Figure 4A:
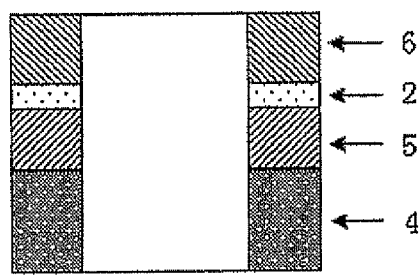
FIGS. 4a and 4b show the cross sectional diagrams of the magnetic multilayered cells of the magnetic logic elements of the closed toroidal pinning magnetic multilayers of this invention without metal core.
Figure 4B:
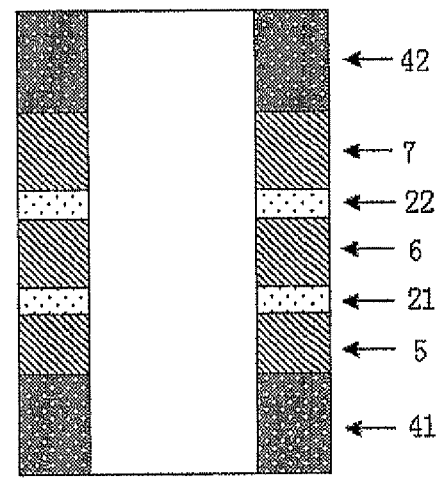
Figure 6:
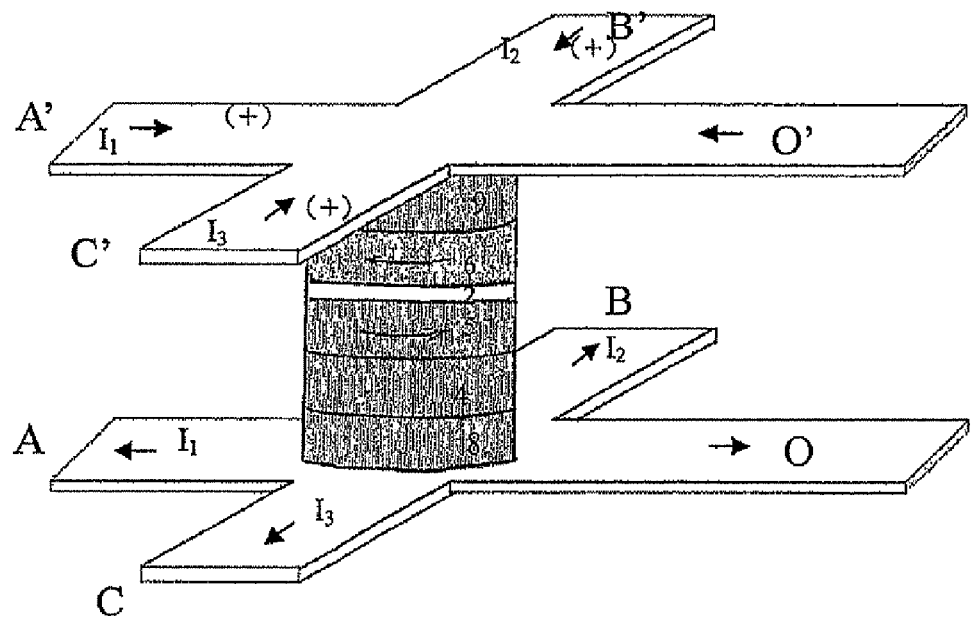
FIG. 6 is the working mode diagram of the magnetic logic element of the closed toroidal pinning magnetic multilayers of this invention without metal core.

As shown in FIGS. 6 and 4a, the specific process of the method for fabricating the third magnetic logic element based on closed toroidal magnetic multilayers is the same as example 1, comprising input signal lines, output signal line and closed toroidal magnetic multilayered cell. The core structure of the closed toroidal magnetic multilayered cell includes an anti-ferromagnetic pinning layer (AFM) 4 of 10 nm thick anti-ferromagnetic material IrMn and a pinned ferromagnetic layer (FM1) 5 of 3 nm thick CoFeB, an intermediate layer (I) 2 of 1.0 nm thick $AL_2O_3$, and a free soft ferromagnetic layer (FM2) 6 of 3 nm thick CoFeB. The closed toroid is a round-shaped ring with a size of the internal ring of 300 nm and a size of the external ring of 400 nm.

The operation mode of the magnetic logic element based on such structure is the same as example 1.

Example 4

The specific process of the method for fabricating the fourth magnetic logic element based on closed toroidal magnetic multilayers is the same as example 1, comprising input signal lines, output signal line and closed toroidal magnetic multilayered cell. The core structure of the closed toroidal magnetic multilayered cell includes an anti-ferromagnetic pinning layer (AFM) 4 of 12 nm thick PtPdMn, a pinned ferromagnetic layer (FM1) 5 of an artificial anti-ferromagnetic coupling magnetic layer CoFe (2 nm)/Ru (0.8 nm)/CoFeB (4 nm), an intermediate layer (I) 2 of 2.0 nm thick MgO (001), a free soft ferromagnetic layer (FM2) 6 of 4 nm thick CoFeB. The closed toroidal shape is an elliptical ring, with the long and short axes of the internal ring being 600 nm and 400 nm respectively, and that of the external ring being 1,000 nm and 800 nm, respectively.

The operation mode of the magnetic logic element based on such structure is the same as example 1.

Example 5

The specific process of the method for fabricating the fifth magnetic logic element based on closed toroidal magnetic multilayers is the same as example 1, comprising input signal lines, output signal line and closed toroidal magnetic multilayered cell. The core structure of the closed toroidal magnetic multilayered cell includes a lower anti-ferromagnetic pinning layer (AFM1) 41 of 12 nm thick PtMn, a pinned ferromagnetic layer (FM1) 5 of CoFe (2 nm)/Ru (0.8 nm)/CoFeB (4 nm), a first intermediate layer (I1) 21 of a 1.8 nm thick MgO, a free soft ferromagnetic layer (FM2) 6 of 6 nm thick CoFeB, a second intermediate layer (I2) 22 of 2.0 nm thick MgO, an upper pinned ferromagnetic layer (FM3) 7 of an artificial anti-ferromagnetic coupling magnetic layers CoFeB (4 nm)/Ru (0.8 nm)/CoFe (4 nm), an upper anti-ferromagnetic pinning layer (AFM2) 42 of 12 nm thick PtMn. The closed toroidal shape is a rectangular ring, with a short side and long side of the internal ring being 1,000 nm and 2,000 nm respectively, and that of the external ring being 1,500 nm and 2,500 nm respectively.

In this solution, the structure of the magnetic multilayers is called double barrier magnetic tunnel junctions, and the free soft ferromagnetic layer (FM2) 6 has a low coercivity (called free layer) and its magnetization is easy to be switched. The pinned ferromagnetic layer (FM1) 5 and the upper pinned ferromagnetic layer (FM3) 7 are pinned by the anti-ferromagnetic PtMn, their magnetizations being relatively fixed, with the same reverse fields, acting as one magnetic layer. Thus, the operating mode of the magnetic logic element based on such structure is the same as example 1.

Example 6

Figure 10:
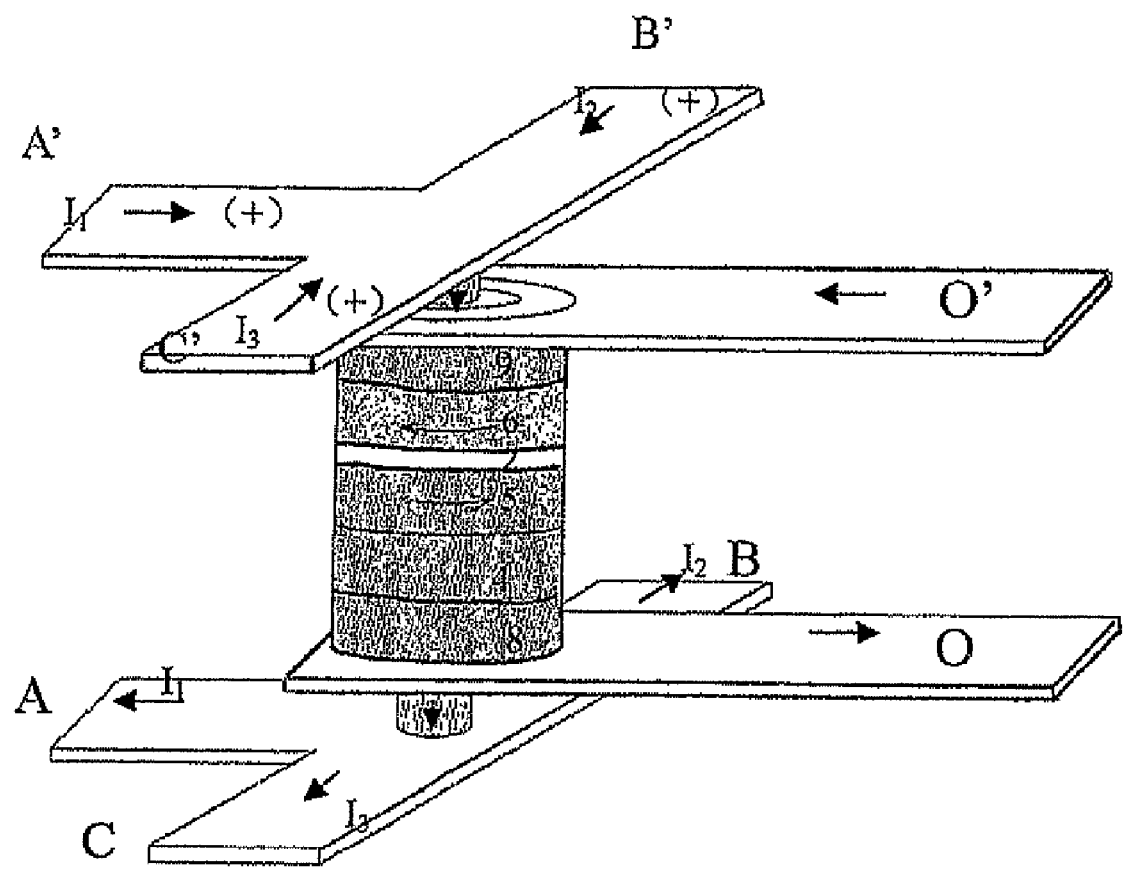
FIG. 10 is the working mode diagram of the magnetic logic element of the closed toroidal pinning magnetic multilayers of this invention with metal core.

As shown in FIGS. 10 and 8a, the method for fabricating the sixth magnetic logic element of this invention based on the closed toroidal magnetic multilayers is similar to example 1.

The difference is that after the closed toroidal magnetic multilayers are patterned by etching, the $SiO_2$ layer is deposited to insulate cells from each other, then the up-to-date microfabrication process is applied, namely, first positioning to the geometric center of the closed toroidal multilayers in the focusing ion beam equipment, followed by etching the $SiO_2$ insulating layer by focusing ion beam to form a column hole with a certain size, afterwards, depositing metal material in the hole by focusing ion beam auxiliary depositing method to form a metal core 10 with a corresponding size and shape. The structure comprises: input signal lines, output signal line and closed toroidal magnetic multilayered cell, and a metal core 10 in the center of the closed ring, wherein the input signal lines and the metal core are connected or one of the input signal lines is configured in the center of the closed ring and connected to the metal core 10. The core structure of the toroidal magnetic multilayers includes an anti-ferromagnetic pinning layer (AFM) 4 of 12 nm thick FeMn, on which 15 nm thick $CO_2MnSi$ is formed as a pinned ferromagnetic layer (FM1) 5, with 2.5 nm thick AlN as the intermediate layer (I) 2, a free ferromagnetic layer (FM2) 6 of artificial anti-ferromagnetic coupling magnetic layer $Ni_{79}Fe_{21}$ (3 nm)/Ru (0/85 nm) $Ni_{79}Fe_{21}$ (3 nm). The internal diameter of the short axis of the elliptical ring is 500 nm, the external diameter of the short axis is 800 nm, the internal diameter of the long axis is 700 nm, and the external diameter of the long axis is 1,000 nm, and the ratio of the internal diameter of the short axis and that of the long axis, of the elliptical ring is 1:1.4 The metal core 10 located in the geometric center of the closed toroidal magnetic multilayers is an elliptical Al metal core, with a short axis of 50 nm, a long axis of 80 nm, with its head exposed from the magnetic multilayered cell and connected to the input signal lines A, A', B, B', and C, C'.

In this solution, when the current is applied to only one input line, the magnetized state of the magnetic multilayers does not change; when applied to two input lines simultaneously, the magnetization of the free ferromagnetic layer (FM2) 6 will reverse; when applied to all the three input lines, the magnetization of the pinned ferromagnetic layer (FM1) 5 may also switch. In comparison with the current design and examples 1-5, the input lines do not directly penetrate the magnetic multilayers, so limit of current allowed to flow is large, leading to a strong toroidal magnetic field, thus facilitating realization of logic operation and further reducing power consumption of the element.

In this solution, realization of the logic function is divided into two steps, the first step being logic setting, and the second step being logic operation. First, two logic functions "AND" and "NOT" will be described.

For AND function, first step, the current is applied to all the input lines, providing "0" signal, then the magnetizations of both the pinned ferromagnetic layer (FM1) 5, free soft ferromagnetic layer (FM2) 6 are counter-clockwise, this being the initial state of the AND logic, at this time, the output is 0, its logic operation being similar to example 1, so details are omitted here. Other logic functions, such as NOT, NOT AND (NAND) and NOT OR NOR) are also similar to example 1.

In addition, this solution can also realize XOR functional function, in the functional logic operation, one input line acting as a functional line. When the current is applied to this input line, it will produce a toroidal magnetic field to enlarge the effective magnetic fields on the magnetic multilayers, thus facilitating reverse of magnetization for the pinned ferromagnetic layer (PM1) 5. Therefore, when another two input lines act simultaneously, the magnetization of the pinned ferromagnetic layer (PM1) 5 will be reversed accordingly. Specific operation process is as follows:

First step, logic setting: applying current to input lines C and C', meanwhile, applying current to input lines A, A', and B, B' to set "0" signal, at this time, the magnetizations of both pinned ferromagnetic layer (FM1) 5 and free soft ferromagnetic layer (FM2) 6 show counter-clockwise directions; then, input lines A, A', B, B' are allocated with "1" signal, no current is applied to input lines C, and C', at this time, the magnetization of the free soft ferromagnetic layer (FM2) shows a clock-wise arrangement; this is the initial state of XOR logic.

Second step, logic process: first applying current signal to input lines C, and C', when the signals of both input lines A, A' and B, B' make the output as low resistant state, getting "0"; when only one of the signals of input lines A, A' and B, B' make the free soft ferromagnetic layer (FM2) at counter-clockwise direction, the output shows high resistant state, getting "1"; when the signal of input signal lines A, A, and B, B' is "1", the output shows low resistant state, getting "0".

It can be seen from this example, the magnetic logic element based on the closed toroidal magnetic multilayers with core lines not only can realize more logic functions, but also facilitate operation of magnetized states of the multilayers and further reducing power consumption of the element.

Example 7

As shown in FIG. 8*a*, the specific process of the method for fabricating the seventh magnetic logic element based on closed toroidal magnetic multilayers is the same as example 6, comprising input signal lines, output signal line and closed elliptical toroidal magnetic multilayered cell and metal core 10 located in the center of the closed elliptical ring. The core structure of the closed toroidal magnetic multilayers includes an anti-ferromagnetic pinning layer (AFM) 4 of 10 nm thick IrMn, a pinned ferromagnetic layer (FM1) 5 of 4 nm thick CoFe, an intermediate layer (I) 2 of 2.5 nm thick MgO, and a free soft ferromagnetic layer (FM2) 6 of 4 nm thick CoFeB. The internal short axis of the elliptical ring is 200 nm, the internal long axis thereof is 300 nm, the external short axis is 400 nm, and the external long axis is 500 nm. The metal core located in the geometric center of the closed toroidal magnetic multilayers is an elliptical Au core, its section with a short axis of 20 nm, a long axis of 30 nm, and its head exposed from the magnetic multilayered cell and contacted with the input signal lines C, and C'.

Example 8

Figure 7A:
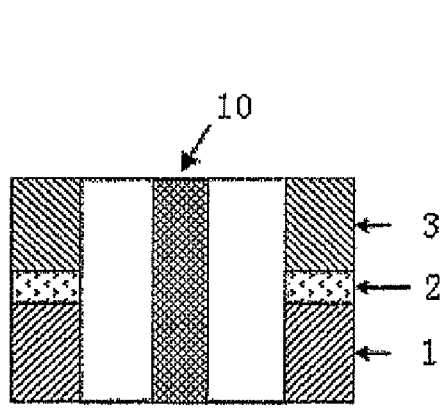
FIGS. 7a and 7b shows the cross sectional diagrams of the magnetic multilayered cells of the magnetic logic elements of the closed toroidal non-pinning magnetic multilayers of this invention with metal core.

As shown in FIG. 7*a*, the specific process of the method for fabricating the eighth magnetic logic element based on closed toroidal magnetic multilayers is the same as example 6, comprising input signal lines, output signal line and closed elliptical toroidal magnetic multilayered cell and metal core 10 located in the center of the closed elliptical ring. The core structure of the closed toroidal magnetic multilayers includes a hard ferromagnetic layer (HFM) 1 of 5 nm thick Co, an intermediate layer (I) 2 of 2.5 nm thick MgO, a soft ferromagnetic layer (SFM) 3 of 2 nm thick CoFeB. The internal short axis of the elliptical ring is 400 nm, the internal long axis thereof is 500 nm, the external short axis is 600 nm, and the external long axis is 700 nm. The metal core located in the geometric center of the closed toroidal magnetic multilayers is an elliptical Au core, its section with a short axis of 40 nm, a long axis of 50 nm, and its head exposed from the magnetic multilayered cell and contacted with the input signal lines C, and C'.

Example 9

Figure 7B:
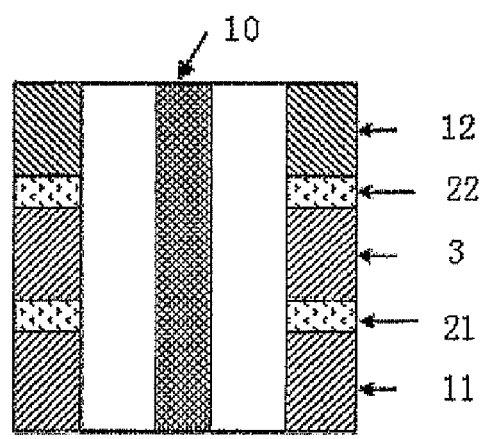

As shown in FIGS. 9 and 7*b*, the specific process of the method for fabricating the ninth magnetic logic element based on closed toroidal magnetic multilayers is the same as example 6, comprising input signal lines, output signal line and closed elliptical toroidal magnetic multilayered cell and metal core located in the center of the closed elliptical ring. The core structure of the closed toroidal magnetic multilayers includes a lower hard ferromagnetic layer (HFM1) 11 of 5 nm thick Co, a first intermediate layer (I1) 21 of 2.5 nm thick MgO, a soft ferromagnetic layer (SFM) 3 of 2 nm thick CoFeB, a second intermediate layer (I2) 22 of 2.5 nm thick MgO, and an upper hard ferromagnetic layer (HFM2) 12 of 5 nm thick Co. The internal short axis of the elliptical ring is 300 nm, the internal long axis thereof is 800 nm, the external short axis is 500 nm, and the external long axis is 1,000 nm. The metal core located in the geometric center of the closed toroidal magnetic multilayers is an elliptical Au core, its section with a short axis of 30 nm, a long axis of 80 nm, and its head exposed from the magnetic multilayered cell and contacted with the input signal lines A, A', B, B', and C, C'.

The lower buffering conductive layer 8 and the upper cover layer 9 of the above examples 2-9 are the same as example 1.

The operation mode of the magnetic logic element of the above examples 7-9 with magnetic multilayered cell is the same as example 6.

It is worthy to note that the toroidal shape in this example may also be square, round and polygonal ring. The magnetic multilayers in this example may also be other structure as described above.

Although this invention is described in conjunction with some particular examples, it is obvious to a person skilled in the art to have many technical solutions, modifications, and variation based on this invention. Therefore, all modifications and variations within the scope and spirit of the claims as attached should be included in this invention.

The invention claimed is:

1. A magnetic logic element with toroidal magnetic multilayers, comprising: a substrate, toroidal magnetic multilayers, a first conductive metal layer between the substrate and the toroidal magnetic multilayers, and a second conductive metal layer over the toroidal magnetic multilayers, wherein input signal lines (A), (B) and (C) and output signal line (O) are formed in the first conductive metal layer, and input signal lines (A'), (B') and (C') and output signal line (O') are formed in the second conductive metal layer;

Wherein, in operation, at least two of the input signal lines (A), (B) and (C), the toroidal magnetic multilayers, and the respective ones of the input signal lines (A'), (B') and (C') constitute input electrical current paths, and the output signal line (O), the toroidal magnetic multilayers, and the output signal line (O') constitute an output electrical current path.

2. The magnetic logic element with toroidal magnetic multilayers according to claim 1, characterized in that the cross section of the closed toroidal magnetic multilayered cell is a closed rectangular ring, elliptic ring or polygonal ring.

3. The magnetic logic element with toroidal magnetic multilayers according to claim 2, characterized in that the width of internal ring of said closed rectangular magnetic multilayers is 10~100,000 nm, the width of external rectangular ring is 20~200,000 nm, and the ratio of the width and the length of internal ring thereof is 1:1~5.

4. The magnetic logic element with toroidal magnetic multilayers according to claim 2, characterized in that the short axis of the internal ring of said closed elliptic magnetic multilayers is 10~100,000 nm, the ratio of the short axis and long axis is 1:1~5, and the short axis of the external elliptic ring is 20~200,000 nm.

5. The magnetic logic element with toroidal magnetic multilayers according to claim 2, characterized in that the internal side length of said closed polygonal magnetic multilayers is 10~100,000 nm, the external side length thereof is 20~200,000 nm, and the width of the closed ring is 10~100,000 nm.

6. A method of logic process using the magnetic logic element with toroidal magnetic multilayers as described in claim 1, comprising the following steps:
   1) Logic setting: applying milli-Ampere or less than milli-Ampere current to two input signal lines (A), (A'), and (B), (B'), or three input signal lines (A), (A'), (B), (B'), and (C), (C'), the current applied to each input signal line being identical or different, and all penetrating the magnetic multilayers, allocating "0" and "1" to the magnetic multilayered cell respectively, reversing the magnetic moment of various magnetic layers so as to set the logic of the logic element by the spin-polarized current based on the spin torque & spin-transfer switching effect and current-induced Oersted field driving;
   2) Logic operation: executing the logic operation by activating only two input signal lines (A), (A'), and (B), (B'), or three input signal lines (A), (A'), (B), (B'), and (C), (C'); only when the current with the same direction being applied to two input signal lines (A), (A'), and (B), (B'), or to three input signal lines (A), (A'), (B), (B'), and (C), (C') producing a magnetic field with the same polarity, a selected initial state can be reversed, changing the output value from "1" to "0", so as to obtain multiple logic states, and the magnitude of the magneto-resistance ratio of the magnetic multilayers acting as the output signal.

7. A magnetic logic element with toroidal magnetic multilayers, comprising: depositing a first conductive metal layer on a substrate, fabricating input signal lines (A), (B) and (C) and an output signal line (O) by etching; or depositing a second conductive metal layer on the input signal lines (A), (B) and (C) to fabricate an output signal line (O) by etching, and depositing a cell with toroidal magnetic multilayers, characterized in that said cell with toroidal magnetic multilayers is deposited on the top of the input signal lines (A), (B) and (C) and the output signal line (O) and fabricated into a closed toroidal magnetic multilayered cell, a metal core is deposited at the geometrical center of the closed toroidal magnetic multilayered cell, and then a third conductive metal layer is deposited on the toroidal magnetic multilayered cell with metal core, and output signal line (O') and input signal lines (A'), (B') and (C') are fabricated by etching; or a fourth conductive metal layer is deposited on the output signal line (O'), and is fabricated into input signal lines (A'), (B') and (C'), wherein at least one of the input signal lines (A) (A'), (B), (B'), and (C), (C') is connected to said metal core, the shape of the metal core matching that of the closed toroidal magnetic multilayered cell, cross section of the metal core being corresponding rectangular or elliptical or polygonal shape, the head of the metal core exposed from the closed toroidal magnetic multilayered cell.

8. The magnetic logic element based on the closed toroidal magnetic multilayers according to claim 7, characterized in that the width of internal rectangular ring of said magnetic multilayered cell is 10~100,000 nm, the width of external rectangular ring is 20~200,000 nm, the ratio of the width of internal rectangular ring and length thereof is 1:1~5; the width of the rectangular cross section of said metal core is 5~50,000 nm, the ratio of the width and length is 1:1~5.

9. The magnetic logic element based on the closed toroidal magnetic multilayers according to claim 7, characterized in that the short axis of the internal elliptic ring of said magnetic multilayered cell is 10~100,000 nm, the ratio of the short axis and long axis is 1:1~5; the short axis of the external elliptic ring is 20~200,000 nm; the short axis of the elliptical cross section of said metal core is 5~50,000 nm, the ratio of the short axis and long axis is 1:1~5.

10. The magnetic logic element based on the closed toroidal magnetic multilayers according to claim 7, characterized in that the internal side length of the polygonal closed ring of said magnetic multilayered cell is 10~100,000 nm, the external side length thereof is 20~200,000 nm, and the width of the closed ring is 10~100,000 nm; each side length of the polygonal cross section of said metal core is 5~50,000 nm.

11. The magnetic logic element having toroidal magnetic multilayers according to claim 7, characterized in that said metal core is made from the materials such as Au, Ag, Pt, Ru, W, Ti, Cu or Al.

12. A method of logic process for realizing low power-consumption logic operation using the magnetic logic element with toroidal magnetic multilayers as described in claim 7, comprising the following steps:
 1) Logic setting: applying milli-Ampere or less than milli-Ampere current to two input signal lines (A), (A'), and (B), (B'), or to three input signal lines (A), (A'), (B), (B'), and (C), (C'), the current applied to each input signal line being identical or different, and all penetrating the metal core of the closed toroidal magnetic multilayers, without penetrating the magnetic multilayers; or two input lines (A), (B) being applied with current to penetrate the magnetic multilayered cell, the other input signal line (C) being the functional line, applied with current to penetrate the metal core, allocating "0" and "1" to the magnetic multilayered cell respectively, reserving the magnetic moment of various magnetic layers so as to set the logic of the logic element by spin-polarized current based on spin torque & spin-transfer switching effect and current-induced Oersted field driving;
 2) Logic operation: executing the logic operation by activating only two input signal lines (A), (A'), and (B), (B'), or three input signal lines (A), (A'), (B), (B'), and (C), (C'); only when current with the same direction is applied to two input signal lines (A), (A'), and (B), (B'), or to three input signal lines (A), (A'), (B), (B'), and (C), (C') producing a magnetic field with the same polarity, a selected initial state can be reversed, changing the output value from "1" to "0", so as to obtain multiple logic states, and the magnitude of the magneto-resistance ratio of the magnetic multilayers acting as output signal.

13. The magnetic logic element with toroidal magnetic multilayers as described in claim 1, characterized in that said conductive metal layer is made from low-resistivity materials, such as Au, Ag, Pt, Ti, Cu or Al.

14. The magnetic logic element with toroidal magnetic multilayers as described in claim 1, characterized in that the magnetic multilayered cell is deposited on a lower buffering conductive layer (8) with a hard ferromagnetic layer (1), an intermediate layer (2) and a soft ferromagnetic layer (3), in turn; or on a lower buffering conductive layer (8) with a lower hard ferromagnetic layer (11), a first intermediate layer (21), a soft ferromagnetic layer (3), a second intermediate layer (22), an upper hard ferromagnetic layer (12) and an upper cover layer (9), in turn.

15. The magnetic logic element with toroidal magnetic multilayers as described in claim 14, characterized in that said hard ferromagnetic layer (1), lower hard ferromagnetic layer (11), upper hard ferromagnetic layer (12) are deposited from Co, Fe, Ni, CoFe or NiFeCo and other ferromagnetic materials with a thickness of 2~20 nm;

Said intermediate layer (2), first intermediate layer (21) and second intermediate layer (22) are made from metal layer or insulator barrier, wherein the metal layer material includes Ti, Zn, ZnMn, Cr, Ru, Cu, V or TiC; the insulator barrier material includes $Al_2O_3$, MgO, TiO, ZnO, (ZnMn)O, CrO, VO, or TiCO; wherein the thickness of the interlayer is 0.5~10 nm;

Said soft ferromagnetic layer (3) is made from ferromagnetic material with high spin polarization and low coercivity, including Co, Fe, Ni or their metal alloys NiFe, CoFeSiB, NiFeSiB, or non-crystalline $Co_{100-x-y}Fe_xB_y$, wherein <x<100, $0 \leqq y \leqq 20$, or Heusler alloys, such as $CO_2MnSi$, $CO_2Cr_{0.6}Pe_{0.4}Al$; said soft ferromagnetic layer having a thickness of 1~20 nm.

16. The magnetic logic element with toroidal magnetic multilayers as described in claim 15, characterized in that said soft ferromagnetic layer materials are $Co_{90}Fe_{10}$, $CO_{75}Fe_{25}$, $Co_{40}Fe_{40}B_{20}$, or $Ni_{79}Fe_{21}$.

17. The magnetic logic element with toroidal magnetic multilayers as described in claim 1, characterized in that the magnetic multilayered cell is deposited on a lower buffering conductive layer (8) with an anti-ferromagnetic pinning layer (4), a pinned ferromagnetic layer (5), an intermediate layer (2), a free soft ferromagnetic layer (6), and an upper cover layer (9), in turn;
 or deposited on a lower buffering conductive layer (8) with an anti-ferromagnetic pinning layer (4), an artificial anti-ferromagnetic coupling magnetic layer, an intermediate layer (2), a free soft ferromagnetic layer (6), and an upper cover layer (9), in turn;
 or deposited on a lower buffering conductive layer (8) with a lower anti-ferromagnetic pinning layer (41), a pinned ferromagnetic layer (5), a first intermediate layer (21), a free soft ferromagnetic layer (6), a second intermediate layer (22), an upper pinned ferromagnetic layer (42), an upper anti-ferromagnetic pinning layer (42), and an upper cover layer (9), in turn;
 or deposited on a lower buffering conductive layer (8) with a lower anti-ferromagnetic pinning layer (41), an artificial anti-ferromagnetic coupling magnetic layer, a first intermediate layer (21), a free soft ferromagnetic layer (6), a second intermediate layer (22), an artificial anti-ferromagnetic coupling magnetic layer, an upper anti-ferromagnetic layer (42), and an upper cover layer (9), in turn;
 said artificial anti-ferromagnetic coupling magnetic layer is composed of two pinned ferromagnetic layers (5) or a free soft ferromagnetic layer (6) or upper pinned ferromagnetic layer (7) sandwiched with a Ru layer.

18. The magnetic logic element with toroidal magnetic multilayers as described in claim 17, characterized in that said anti-ferromagnetic pinning layer (4), lower anti-ferromagnetic pinning layer (41) and upper anti-ferromagnetic pinning layer (42) are made from alloy materials such as Ir, Fe, Rh, Pt or Pd and Mn, or anti-ferromagnetic materials such as CoO, NiO, or PtCr with a thickness of 6~20 nm;

Said pinned ferromagnetic layer (5), free soft ferromagnetic layer (6), upper pinned ferromagnetic layer (7), and artificial anti-ferromagnetic coupling magnetic layer are made from ferromagnetic material, semi-metal magnetic material or magnetic semiconductor material;

Wherein said pinned ferromagnetic layer (5), free soft ferromagnetic layer (6), upper pinned ferromagnetic layer (7), and artificial anti-ferromagnetic coupling magnetic layer has a thickness of 2~10 nm;

Said ferromagnetic material includes 3d transitional magnetic metals such as Fe, Co, Ni, ferromagnetic metal alloys such as Co—Fe, Co—Fe—B, Ni—Fe, Co—Fe—Ni, Gd—Y, and rare-earth metals and their ferromagnetic alloys such as Pr, Nd, Sm, Gd, Tb, Dy, Ho, Er;

Said semi-metal magnetic material includes Heussler alloys of $Fe_3O_4$, $CrO_2$, $La_{0.7}Sr_{0.3}MnO_3$ and $CO_2MnSi$;

Said magnetic semiconductor material includes Fe, Co, Ni, V and Mn doped ZnO, $TiO_2$, $HfO_2$ or $SnO_2$, also includes Mn doped GaAs, InAs, GaN or ZnTe;

Said Ru layer has a thickness of 0.7~0.9 nm;

Said intermediate layer (2), first intermediate layer (21), and second intermediate layer (22) are made from insulating oxides such as MgO, $Al_2O_3$, AlN, $Ta_2O_5$, or $HfO_2$, or metal materials such as Ti, Zn, ZnMn, Cr, Ru, Cu, V or TiC with a thickness of 0.6~10 nm.

19. The magnetic logic element with toroidal magnetic multilayers as described in claim 7, characterized in that said conductive metal layer is made from low-resistivity materials, such as Au, Ag, Pt, Ti, Cu or Al.

20. The magnetic logic element with toroidal magnetic multilayers as described in claim 7, characterized in that the magnetic multilayered cell is deposited on a lower buffering conductive layer (8) with a hard ferromagnetic layer (1), an intermediate layer (2) and a soft ferromagnetic layer (3), in turn; or on a lower buffering conductive layer (8) with a lower hard ferromagnetic layer (11), a first intermediate layer (21), a soft ferromagnetic layer (3), a second intermediate layer (22), an upper hard ferromagnetic layer (12) and an upper cover layer (9), in turn.

21. The magnetic logic element with toroidal magnetic multilayers as described in claim 7, characterized in that the magnetic multilayered cell is deposited on a lower buffering conductive layer (8) with an anti-ferromagnetic pinning layer (4), a pinned ferromagnetic layer (5), an intermediate layer (2), a free soft ferromagnetic layer (6), and an upper cover layer (9), in turn;

or deposited on a lower buffering conductive layer (8) with an anti-ferromagnetic pinning layer (4), an artificial anti-ferromagnetic coupling magnetic layer, an intermediate layer (2), a free soft ferromagnetic layer (6), and an upper cover layer (9), in turn;

or deposited on a lower buffering conductive layer (8) with a lower anti-ferromagnetic pinning layer (41), a pinned ferromagnetic layer (5), a first intermediate layer (21), a free soft ferromagnetic layer (6), a second intermediate layer (22), an upper pinned ferromagnetic layer (42), an upper anti-ferromagnetic pinning layer (42), and an upper cover layer (9), in turn;

or deposited on a lower buffering conductive layer (8) with a lower anti-ferromagnetic pinning layer (41), an artificial anti-ferromagnetic coupling magnetic layer, a first intermediate layer (21), a free soft ferromagnetic layer (6), a second intermediate layer (22), an artificial anti-ferromagnetic coupling magnetic layer, an upper anti-ferromagnetic layer (42), and an upper cover layer (9), in turn;

said artificial anti-ferromagnetic coupling magnetic layer is composed of two pinned ferromagnetic layers (5) or a free soft ferromagnetic layer (6) or upper pinned ferromagnetic layer (7) sandwiched with a Ru layer.

* * * * *